(12) United States Patent
Muraoka et al.

(10) Patent No.: US 8,193,807 B2
(45) Date of Patent: Jun. 5, 2012

(54) MAGNETIC SENSOR DEVICE

(75) Inventors: Daisuke Muraoka, Chiba (JP); Minoru Ariyama, Chiba (JP); Tomoki Hikichi, Chiba (JP); Manabu Fujimura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 280 days.

(21) Appl. No.: 12/779,582

(22) Filed: May 13, 2010

(65) Prior Publication Data

US 2010/0308815 A1   Dec. 9, 2010

(30) Foreign Application Priority Data

Jun. 8, 2009 (JP) .................................. 2009-137667

(51) Int. Cl.
*G01R 33/06* (2006.01)

(52) U.S. Cl. ................. 324/251; 324/207.25; 324/117 R

(58) Field of Classification Search ........................ None
See application file for complete search history.

(56) References Cited

U.S. PATENT DOCUMENTS

| 6,777,932 B2 | 8/2004 | Hara et al. | |
| 7,570,044 B2 * | 8/2009 | Takeda | 324/117 H |

FOREIGN PATENT DOCUMENTS

JP   2001-337147 A   12/2001

* cited by examiner

*Primary Examiner* — Minh N Tang
(74) *Attorney, Agent, or Firm* — Brinks Hofer Gilson & Lione

(57) ABSTRACT

Provided is a magnetic sensor device including: a switching circuit that controls switching of a terminal pair of the magnetoelectric conversion element to which a supply voltage is applied and a terminal pair to which detection voltage of a magnetic intensity is output; a differential amplifier that differentially amplifies the detection voltage; a first capacitor connected to a first output terminal of the differential amplifier; a second switch connected to a second output terminal of the differential amplifier; a comparator that has a first input terminal connected to the first capacitor and a second input terminal connected to the second switch; a first switch connected between the first input terminal and an output terminal of the comparator; and a second capacitor connected to the second input terminal of the comparator; and a detection voltage setting circuit connected to the second capacitor, in which effects of respective offset voltages of the magnetoelectric conversion element, the amplifier, and the comparator are suppressed, and an arbitrary detection magnetic field intensity is set to enable accurate magnetic reading.

6 Claims, 5 Drawing Sheets

MAGNETIC SENSOR DEVICE

RELATED APPLICATIONS

This application claims priority under 35 U.S.C. §119 to Japanese Patent Application No. 2009-137667 filed on Jun. 8, 2009, the entire content of which is hereby incorporated by reference.

BACKGROUND OF THE INVENTION

1. Field of the Invention

The present invention relates to a magnetic sensor device for converting a magnetic field intensity into an electric signal, and more particularly to a magnetic sensor device to be employed as a sensor for detecting an open/close state used in a flip phone, a notebook computer, or the like, or a sensor for detecting a rotational position of a motor.

2. Description of the Related Art

A magnetic sensor device has been employed as a sensor for detecting the open/close state used in a flip phone, a notebook computer, or the like, or a sensor for detecting a rotational position of a motor (for example, refer to Japanese Patent Application Laid-open No. 2001-337147). A circuit diagram of the magnetic sensor device is illustrated in FIG. 7.

In the magnetic sensor device, a magnetoelectric conversion element (for example, Hall element) outputs a voltage proportional to a magnetic field intensity or a magnetic flux density, an amplifier amplifies the output voltage, and a comparator judges the voltage (outputs a binary signal of an H signal or an L signal). The output voltage of the magnetoelectric conversion element is minute, and is easily affected by an offset voltage (element offset voltage) of the magnetoelectric conversion element, an offset voltage (input offset voltage) of the amplifier or the comparator, or noise within the conversion device, which leads to a problem. The element offset voltage is mainly developed by a stress exerted on the magnetoelectric conversion element by a package. The input offset voltage is mainly developed by a characteristic variation of an element that configures an input circuit of the amplifier. The noise is mainly generated by a flicker noise of a monolithic transistor that configures a circuit, or a thermal noise of the monolithic transistor or a resistive element.

In order to reduce an influence of the above-mentioned offset voltage of the magnetoelectric conversion element or the amplifier, the magnetic sensor device illustrated in FIG. 7 is configured as follows. The magnetic sensor device illustrated in FIG. 7 is configured to include a Hall element 1, a switching circuit 2 that switches between a first detection state and a second detection state of the Hall element 1, a differential amplifier 3 that amplifies a voltage difference (V1−V2) of two output terminals of the switching circuit 2, a capacitor C1 having one end connected to one output terminal of the differential amplifier 3, a switch S1 connected between the other output terminal of the differential amplifier 3 and the other end of the capacitor C1, and a comparator 4. In the first detection state, a supply voltage is input from terminals A and C, and a detection voltage is output from terminals B and D. In the second detection state, the supply voltage is input from the terminals B and D, and the detection voltage is output from the terminals A and C.

It is assumed that a differential output voltage of the magnetoelectric conversion element is Vh, a gain of the differential amplifier is G, and the input offset voltage of the differential amplifier is Voa. In the first detection state, the switch S1 turns on, and the capacitor C1 is charged with Vc1=(V3−V4)=G(Vh1+Voa). Then, in the second detection state, the switch S1 turns off, and Vc2=(V3−V4)=G(−Vh2+Voa) is output. Here, V5−V6=V3−Vc1−V4=Vc2−Vc1=−G(Vh1+Vh2) is satisfied, to thereby offset the effect of the input offset voltage. Further, the detection voltages Vh1 and Vh2 of the magnetoelectric conversion element have an in-phase valid signal component and a reverse-phase element offset component, and hence the effect of the element offset component is also removed from the above-mentioned output voltage.

However, the above-mentioned magnetic sensor device according to the related art suffers from such a problem that the input offset voltage of the comparator 4 connected to a subsequent stage may not be removed, and the detected magnetic field intensity is varied.

SUMMARY OF THE INVENTION

In view of the above-mentioned circumstances, an object of the present invention is to provide a magnetic sensor device which may remove effects of an element offset voltage and an input offset voltages of an amplifier and a comparator with a relatively simple circuit configuration so as to detect a magnetic field intensity with high precision.

In order to solve the above-mentioned problem with the related art, the magnetic sensor device according to the present invention is configured as follows.

According to the present invention, there is provided a magnetic sensor device including: a switching circuit that is connected with a first terminal pair and a second terminal pair of a magnetoelectric conversions element, controls switching of the terminal pair to which a supply voltage is applied and a terminal pair to which detection voltage of the magnetic intensity is output, and has a first output terminal and a second output terminal which output the detection voltage; a differential amplifier that has a first input terminal and a second input terminal connected to the first output terminal and the second output terminal of the switching circuit, respectively, and has a first output terminal and a second output terminal which output results of differentially amplifying the detection voltage; a first capacitor having one terminal connected to the first output terminal of the differential amplifier; a second switch having one terminal connected to the second output terminal of the differential amplifier; a comparator that has a first input terminal connected to another terminal of the first capacitor and a second input terminal connected to the another terminal of the second switch, and outputs a comparison result of voltages input to the first input terminal and the second input terminal to an output terminal; a first switch connected between the first input terminal and the output terminal of the comparator; a second capacitor having terminal connected to the second input terminal of the comparator; and a detection voltage setting circuit connected to another terminal of the second capacitor.

According to the magnetic sensor device of the present invention, the offset component generated in the magnetoelectric conversion element, the differential amplifier, and the comparator in the magnetic sensor device may be removed with a simple circuit configuration effectively utilizing the switch and the capacitor. Also, a detection voltage level of the magnetic field intensity may be set with high precision. Accordingly, the present invention may provide the magnetic sensor device capable of detecting the magnetic field intensity with high precision.

US 8,193,807 B2

DETAILED DESCRIPTION OF THE PREFERRED EMBODIMENTS

An embodiment of the present invention is described below in detail with reference to the accompanying drawings. A magnetic sensor device according to the present invention is widely used as a sensor for detecting a state of a magnetic field intensity, such as a sensor for detecting an open/close state in a flip phone or a notebook computer, or a sensor for detecting a rotational position of a motor. In the following embodiment, a magnetic sensor device using a magnetoelectric conversion element is described. A conversion device according to the present invention may employ a conversion element that similarly outputs a voltage according to acceleration or a pressure, in place of the magnetoelectric conversion element that outputs a voltage according to the magnetic field intensity.

Figure 1:
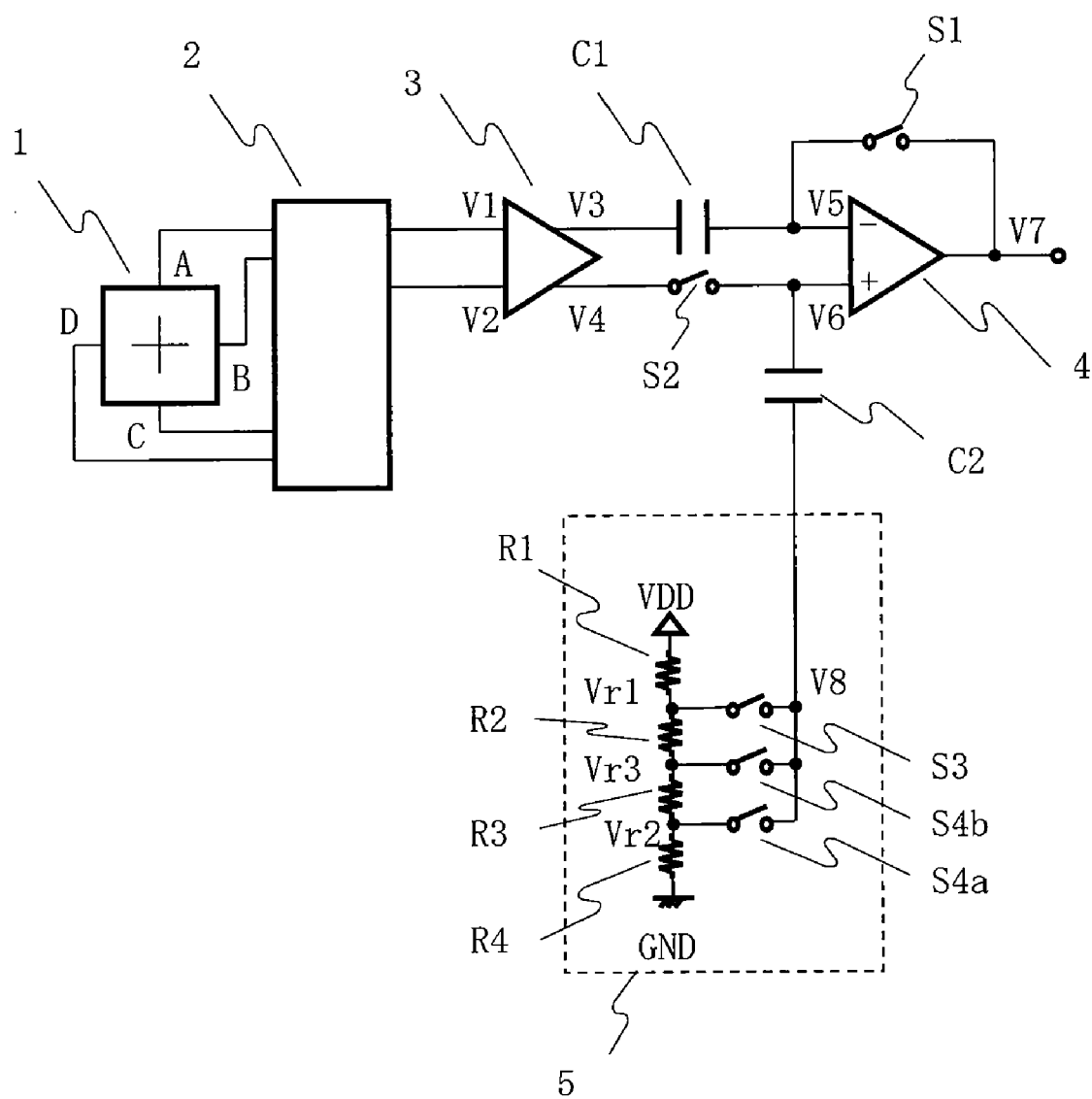
FIG. 1 is a circuit diagram illustrating a magnetic sensor device according to the present invention.

FIG. 1 is a circuit diagram of the magnetic sensor device according to the present invention. The magnetic sensor device according to the present invention includes a Hall element 1 that is a magnetoelectric conversion element, a switching circuit 2, a differential amplifier 3, an amplifier 4, a detection voltage setting circuit 5, a first capacitor C1, a second capacitor C2, a first switch S1, and a second switch S2.

The Hall element 1 has a first terminal pair A-C and a second terminal pair B-D. The switching circuit 2 has four input terminals connected to the respective terminals A, B, C, and D of the Hall element 1, a first output terminal, and a second output terminal. The differential amplifier 3 has a first input terminal and a second input terminal which are connected to the first output terminal and the second output terminal of the switching circuit 2, respectively, a first output terminal, and a second output terminal. The first capacitor C1 has one terminal connected to the first output terminal of the differential amplifier 3. The second switch S2 has one terminal connected to the second output terminal of the differential amplifier 3. The comparator 4 has a first input terminal connected with the other terminal of the first capacitor C1 and a second input terminal connected with the other terminal of the second switch S2, and outputs a comparison result of the voltages input to the respective input terminals to an output terminal. The first switch S1 is connected between the first input terminal and the output terminal of the comparator 4. The second capacitor C2 has one terminal connected to the second input terminal of the comparator 4. The detection voltage setting circuit 5 is connected to the other terminal of the second capacitor C2. The detection voltage setting circuit 5 has bleeder resistors connected between a supply terminal VDD and a ground terminal GND, and a switch circuit that connects connection points of the respective resistors and the other terminal of the second capacitor C2.

The switching circuit 2 has a function of switching between a first detection state in which the supply voltage is input to the first terminal pair A-C of the Hall element 1 while the detection voltage is output from the second terminal pair B-D of the Hall element 1, and a second detection state in which the supply voltage is input to the second terminal pair B-D while the detection voltage is output from the first terminal pair A-C.

Figure 4:
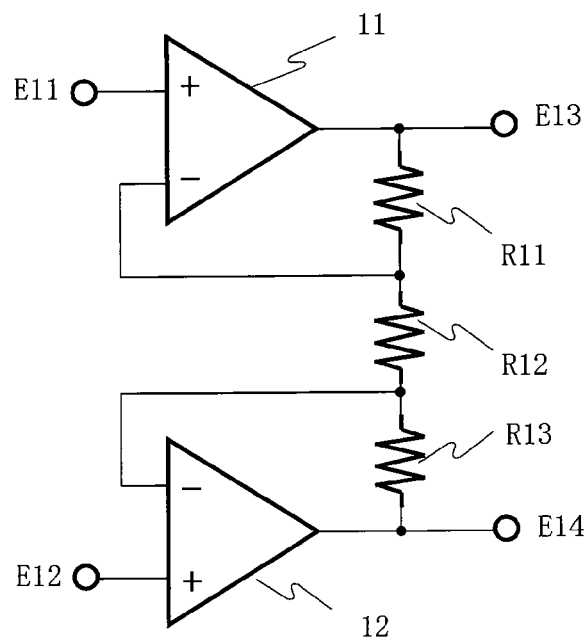
FIG. 4 is a circuit diagram illustrating an example of a differential amplifier in the magnetic sensor device according to the present invention.

The differential amplifier 3 is configured as an instrumentation amplifier illustrated in FIG. 4. The differential amplifier 3 has differential amplifiers 11, 12, and resistors R11, R12, R13. Each of the differential amplifiers 11 and 12 function as a noninverting amplifier. The differential amplifier 3 has the first input terminal connected to a noninverting input terminal of the differential amplifier 11, the second input terminal connected to a noninverting input terminal of the differential amplifier 12, the first output terminal connected to an output terminal of the differential amplifier 11, and the second output terminal connected to an output terminal of the differential amplifier 12. The differential amplifier 3 is configured as such an instrumentation amplifier, to thereby suppress the effect of in-phase noise in the differential input. In this example, it is assumed that the gains of the differential amplifiers 11 and 12 are set to be equal to each other.

Figure 6:
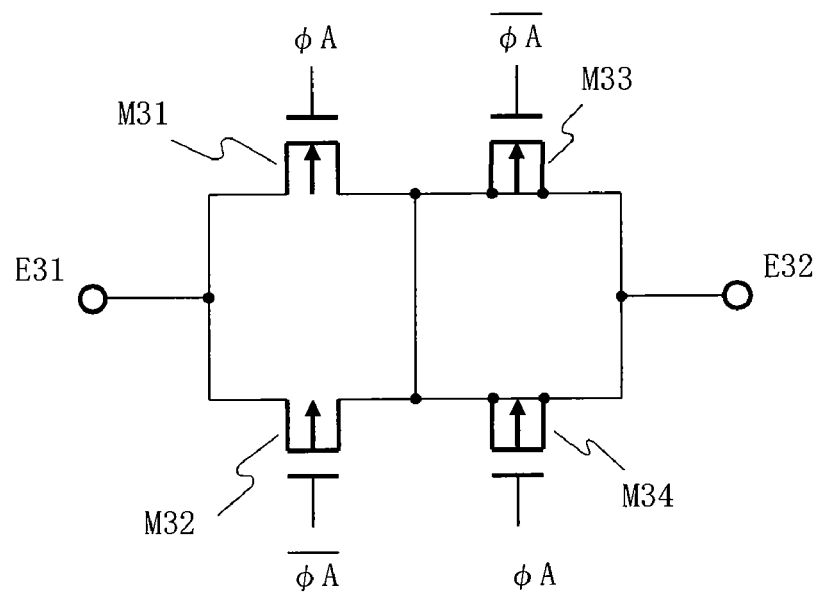
FIG. 6 is a circuit diagram illustrating an example of an analog switch in the magnetic sensor device according to the present invention.
Figure 7:
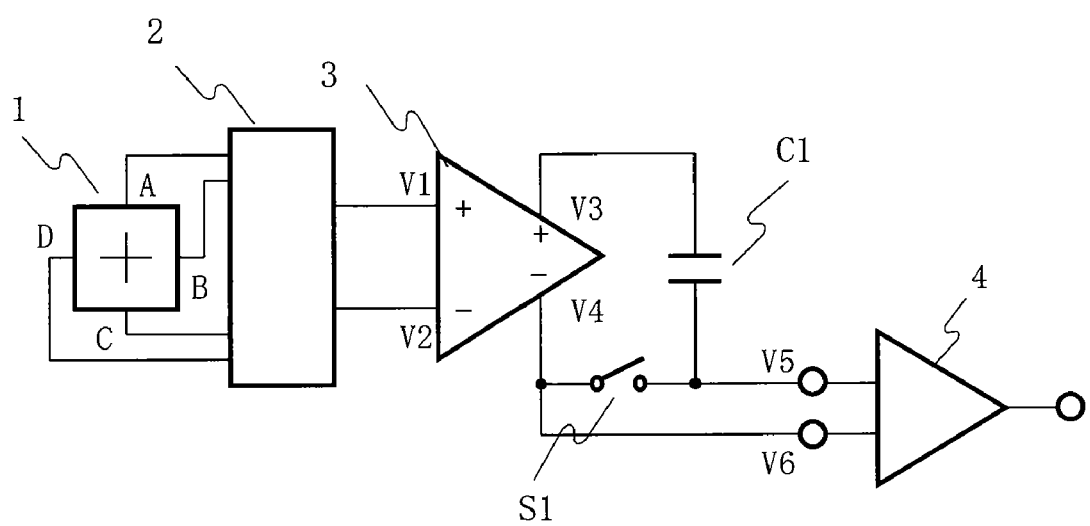
FIG. 7 is a circuit diagram illustrating a magnetic sensor device according to a related art.

The switches S1 and S2 are each formed of an analog switch as illustrated in FIG. 6. The analog switch includes two transmission gates connected in series between the input terminal and the output terminal. The transmission gate on the input terminal side includes an NMOS transistor M31 and a PMOS transistor M32. The transmission gate on the output terminal side includes an NMOS transistor M33 and a PMOS transistor M34 having corresponding sources and drains short-circuited. In this example, the NMOS transistor M33 is set to an L length which is equal to the NMOS transistor 31, and a W length which is the half thereof. Likewise, the PMOS transistor M34 is set to an L length which is equal to the PMOS transistor 32, and a W length which is the half thereof. A signal φA is input to gates of the NMOS transistor M31 and the PMOS transistor M34, and a signal obtained by inverting the signal φA is input to gates of the PMOS transistor M32 and the NMOS transistor M33. In this example, since the analog switch illustrated in FIG. 6 generates no noise on the output terminal side, the first switch S1 sets the first capacitor C1 side as the output terminal, and the second switch S2 sets the second capacitor C2 side as the output terminal.

Subsequently, the operation of the magnetic sensor device according to the present invention is described. In a first embodiment, it is assumed that the differential amplifier 3 has a configuration of FIG. 4, and the respective switches are driven according to a timing chart for a switch control signal of FIG. 2.

One period T in detection operation is divided into a first detection state T1 and a second detection state T2 according to the operation of the above-mentioned switching circuit 2. The period T of the detection operation is also divided into a first sample phase F1, a second sample phase F2, and a comparison phase F3 according to the open/close states of the respective switches. In the first sample phase F1, the offset components of the Hall element 1, the differential amplifier 3, and the comparator 4 are stored in the capacitors C1 and C2. In the second sample phase F2, preparations are made for setting a detection voltage level of the magnetic field intensity. In the comparison phase F3, a voltage determined according to the magnetic field intensity is compared with the detection voltage level.

In the first sample phase F1, the Hall element 1 goes into the first detection state T1, and the switches S1, S2, and S3 turn on. When the switch S1 turns on, the comparator 4 operates as a voltage follower circuit. Accordingly, the capacitor C1 is charged with a difference $\Delta C1$ between a voltage V3 and a voltage V5.

$$\Delta C1 = V3 - V5 \quad (1)$$

In the second sample phase F2, the Hall element 1 goes into the second detection state T2, and the switch S1 turns off. The capacitor C1 stores $\Delta C1$, and hence the voltage V5 is represented by Expression (2).

$$V5 = V3 - \Delta C1 \quad (2)$$

The capacitor C2 is charged with a difference $\Delta C2$ between a voltage V6 and a voltage V8.

$$\Delta C2 = V6 - V8 = V6 - Vr1 \quad (3)$$

In the comparison phase F3, the switches S2 and S3 turn off, and the switch S4a turns on. As a result, because $\Delta C2$ is stored in the capacitor C2, the voltage V6 is represented by Expression (4).

$$V6 = V8 + \Delta C2 = Vr2 + \Delta C2 \quad (4)$$

Finally, in the comparator 4, the voltage V5 represented by Expression (2) and the voltage V6 represented by Expression (4) are compared with each other, and an H signal (VDD) or an L signal (GND) is output.

Next, assuming that a differential output voltage in the output terminal pair of the Hall element 1 is Vh, an in-phase voltage is Vcm ($\approx$VDD/2), and a gain of the differential amplifier 3 is G, the transmission of a valid signal component is described. The calculation is made based on Expressions (1) to (4) described above.

In the first sample phase F1, voltages at the respective nodes are represented as follows.

$$V1 = Vcm + Vh/2, V2 = Vcm - Vh/2 \quad (5)$$

$$V3 = Vcm + GVh/2, V4 = Vcm - GVh/2 \quad (6)$$

$$V5 = V7 = V6 = V4 = Vcm - GVh/2 \quad (7)$$

$$\Delta C1 = V3 - V5 = GVh \quad (8)$$

In the second sample phase F2, voltages at the respective nodes are represented as follows.

$$V1 = Vcm - Vh/2, V2 = Vcm + Vh/2 \quad (9)$$

$$V3 = Vcm - GVh/2, V4 = Vcm + GVh/2 \quad (10)$$

$$V5 = V3 - \Delta C1 = Vcm - 3GVh/2 \quad (11)$$

$$\Delta C2 = V6 - V8 = Vcm + GVh/2 - Vr1 \quad (12)$$

In the comparison phase F3, voltages at the respective nodes are represented as follows.

$$V5 = Vcm - 3GVh/2 \quad (13)$$

$$V6 = Vr2 + \Delta C2 = Vcm + GVh/2 + Vr2 - Vr1 \quad (14)$$

$$V6 - V5 = 2GVh + Vr2 - Vr1 \quad (15)$$

Accordingly, in the comparison phase F3, in the comparator 4, a signal component 2GVh and a detection voltage component (Vr1−Vr2) determined according to a resistance ratio of the bleeder resistors are compared with each other.

Then, the same calculation is conducted assuming that the element offset voltage of the Hall element 1 is Voh. In the above-mentioned calculation, because the output voltage component of the Hall element 1 is reversed in phase between the first detection state and the second detection state, the element offset component is in phase.

In the first sample phase F1, voltages at the respective nodes are represented as follows.

$$V1 = Vcm + Voh/2, V2 = Vcm - Voh/2 \quad (16)$$

$$V3 = Vcm + GVoh/2, V4 = Vcm - GVoh/2 \quad (17)$$

$$V5 = V7 = V6 = V4 = Vcm - GVoh/2 \quad (18)$$

$$\Delta C1 = V3 - V5 = GVoh \quad (19)$$

In the second sample phase F2, voltages at the respective nodes are represented as follows.

$$V1 = Vcm + Voh/2, V2 = Vcm - Voh/2 \quad (20)$$

$$V3 = Vcm + GVoh/2, V4 = Vcm - GVoh/2 \quad (21)$$

$$V5 = V3 - \Delta C1 = Vcm - GVoh/2 \quad (22)$$

$$\Delta C2 = V6 - V8 = Vcm - GVoh/2 - Vr1 \quad (23)$$

In the comparison phase F3, voltages at the respective nodes are represented as follows.

$$V5 = Vcm - GVoh/2 \quad (24)$$

$$V6 = Vr2 + \Delta C2 = Vcm - GVoh/2 + Vr2 - Vr1 \quad (25)$$

$$V6 - V5 = Vr2 - Vr1 \quad (26)$$

Accordingly, in the comparison phase F3, the element offset component is removed.

Then, the same calculation is conducted assuming that an input offset voltage at the first input terminal of the differential amplifier 3 is Voa1, an input offset voltage at the second input terminal is Voa2, and an input offset voltage of the comparator 4 is Voa3.

In the first sample phase F1, voltages at the respective nodes are represented as follows.

$$V1 = Vcm, V2 = Vcm \quad (27)$$

$$V3 = Vcm + GVoa1, V4 = V6 = Vcm + GVoa2 \quad (28)$$

$$V5 = V7 = V6 + Voa3 = Vcm + GVoa2 + Voa3 \quad (29)$$

$$\Delta C1 = V3 - V5 = GVoa1 - GVoa2 - Voa3 \quad (30)$$

In the second sample phase F2, voltages at the respective nodes are represented as follows.

$$V1 = Vcm, V2 = Vcm \quad (31)$$

$$V3 = Vcm + GVoa1, V4 = V6 = Vcm + GVoa2 \quad (32)$$

$$V5 = V3 - \Delta C1 = Vcm + GVoa2 + Voa3 \quad (33)$$

$$\Delta C2 = V6 - V8 = Vcm + GVoa2 - Vr1 \quad (34)$$

In the comparison phase F3, voltages at the respective nodes are represented as follows.

$$V5 = Vcm + GVoa2 + Voa3 \quad (35)$$

$$V6 = Vr2 + \Delta C2 = Vcm + GVoa2 + Vr2 - Vr1 \quad (36)$$

Comparison is made taking the input offset component of the comparator 4 at the time of comparison into consideration, that is, by adding Voa3 to V6 at the time of comparison.

$$(V6+Voa3)-V5=Vr2-Vr1 \quad (37)$$

Accordingly, in the comparison phase F3, the input offset components of the differential amplifier 3 and the comparator 4 are removed.

The above description is summarized as follows. As represented by Expressions (15), (26), and (37) described above, in the magnetic sensor device according to the present invention, all of the offset components generated in the Hall element 1, the differential amplifier 3, and the comparator 4 may be removed. Also, the detection voltage level of the magnetic field intensity may be arbitrarily set based only on the resistance ratio of the bleeder resistors. As a result, only the signal component detected by the magnetoelectric conversion element is compared with the above-mentioned detection voltage set according to the resistance ratio of the bleeder resistors, to thereby realize the detection of the magnetic field intensity with high precision.

The above-mentioned in-phase voltage of the Hall element 1 is set as the in-phase voltage Vcm common to the first detection state and the second detection state. However, the same effect is obtained even if the voltage is different therebetween.

Further, in the magnetic sensor device according to the present invention, the capacitors C1 and C2 are connected to the respective input terminals of the comparator 4, and hence the effects of clock field through noise and charge injection noise generated at an instant when the respective switches connected to the input terminals are opened or closed may be suppressed. In addition, each of the switches S1 and S2 is formed of the analog switch illustrated in FIG. 6, and hence the effect of noise may be further suppressed. Accordingly, the magnetic sensor device is capable of detecting the magnetic field intensity with high precision. The analog switch illustrated in FIG. 6 may also be used for the switches S3, S4a, and S4b.

Figure 5:
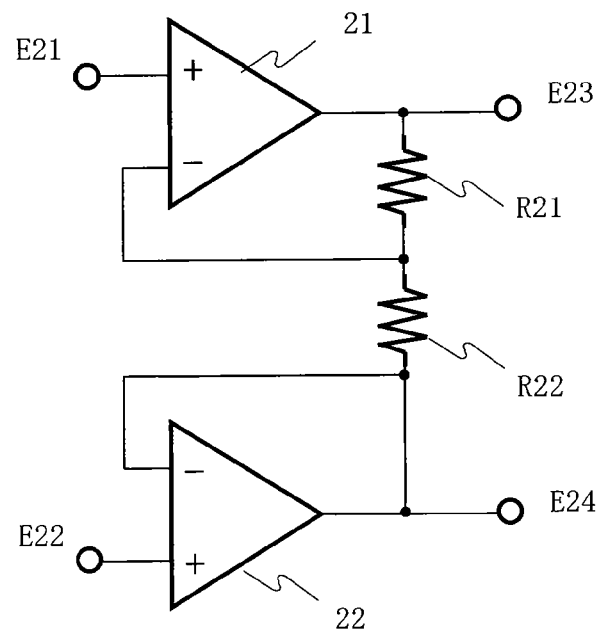
FIG. 5 is a circuit diagram illustrating another example of the differential amplifier in the magnetic sensor device according to the present invention.

Assuming that the differential amplifier 3 is configured as illustrated in FIG. 5, the operation of the magnetic sensor device according to the present invention is described below.

The differential amplifier 3 illustrated in FIG. 5 includes differential amplifiers 21, 22 and resistors R21, R22. The differential amplifier 21 functions as a noninverting amplifier, and the differential amplifier 22 functions as a voltage follower. The differential amplifier 3 has the first input terminal connected to a noninverting input terminal of the differential amplifier 21, the second input terminal connected to a noninverting input terminal of the differential amplifier 22, the first output terminal connected to an output terminal of the differential amplifier 21, and the second output terminal connected to an output terminal of the differential amplifier 22. In this configuration, calculations represented by Expressions (5) to (37) described above are similarly conducted in a state where the valid signal component and the respective offset components are mixed together.

In the first sample phase F1, voltages at the respective nodes are represented as follows.

$$V1=Vcm+Vh/2+Voh/2 \quad (38)$$

$$V2=Vcm-Vh/2-Voh/2 \quad (39)$$

$$V3=Vcm-Vh/2-Voh/2+Voa2+G(Vh+Voh+Voa1-Voa2) \quad (40)$$

$$V4=V6=Vcm-Vh/2-Voh/2+Voa2 \quad (41)$$

$$V5=V7=Vcm-Vh/2-Voh/2+Voa2+Voa3 \quad (42)$$

$$\Delta C1=G(Vh+Voh+Voa1-Voa2)-Voa3 \quad (43)$$

In the second sample phase F2, voltages at the respective nodes are represented as follows.

$$V1=Vcm-Vh/2+Voh/2 \quad (44)$$

$$V2=Vcm+Vh/2-Voh/2 \quad (45)$$

$$V3=Vcm+Vh/2-Voh/2+Voa2+G(-Vh+Voh+Voa1-Voa2) \quad (46)$$

$$V4=V6=Vcm+Vh/2-Voh/2+Voa2 \quad (47)$$

$$V5=Vcm+Vh/2-Voh/2-2GVh+Voa2+Voa3 \quad (48)$$

$$\Delta C2=Vcm+Vh/2-Voh/2+Voa2-Vr1 \quad (49)$$

In the comparison phase F3, voltages at the respective nodes are represented as follows.

$$V5=Vcm+Vh/2-Voh/2-2GVh+Voa2+Voa3 \quad (50)$$

$$V6=Vcm+Vh/2-Voh/2+Voa2+Vr2-Vr1 \quad (51)$$

Comparison is made taking the input offset component of the comparator 4 at the time of comparison into consideration, that is, by adding the voltage Voa3 to the voltage V6 at the time of comparison.

$$(V6+Voa3)-V5=2GVh+Vr2-Vr1 \quad (52)$$

Accordingly, in the comparison phase F3, the signal component 2GVh and the detection voltage component (Vr1−Vr2) determined according to the resistance ratio of the bleeder resistors are compared with each other. That is, the same effect is obtained even when the differential amplifier 3 is configured as illustrated in FIG. 5.

The node voltages V5 and V6 in the comparison phase F3 include no offset components amplified by the differential amplifier 3, as is understood from Expressions (50) and (51). Accordingly, because no amplified offset components exist at the respective input terminals of the comparator 4 at the time of comparison, an in-phase input voltage range of the comparator 4 may be effectively utilized. This exhibits that the normal operation of the magnetic sensor device is enabled even under the environments of the lower supply voltage.

The above-mentioned in-phase voltage of the Hall element 1 is set as the in-phase voltage Vcm common to the first detection state and the second detection state. However, even if the in-phase voltage is different therebetween, there is no effect on the components to be compared, and the same effect is obtained.

Figure 3:
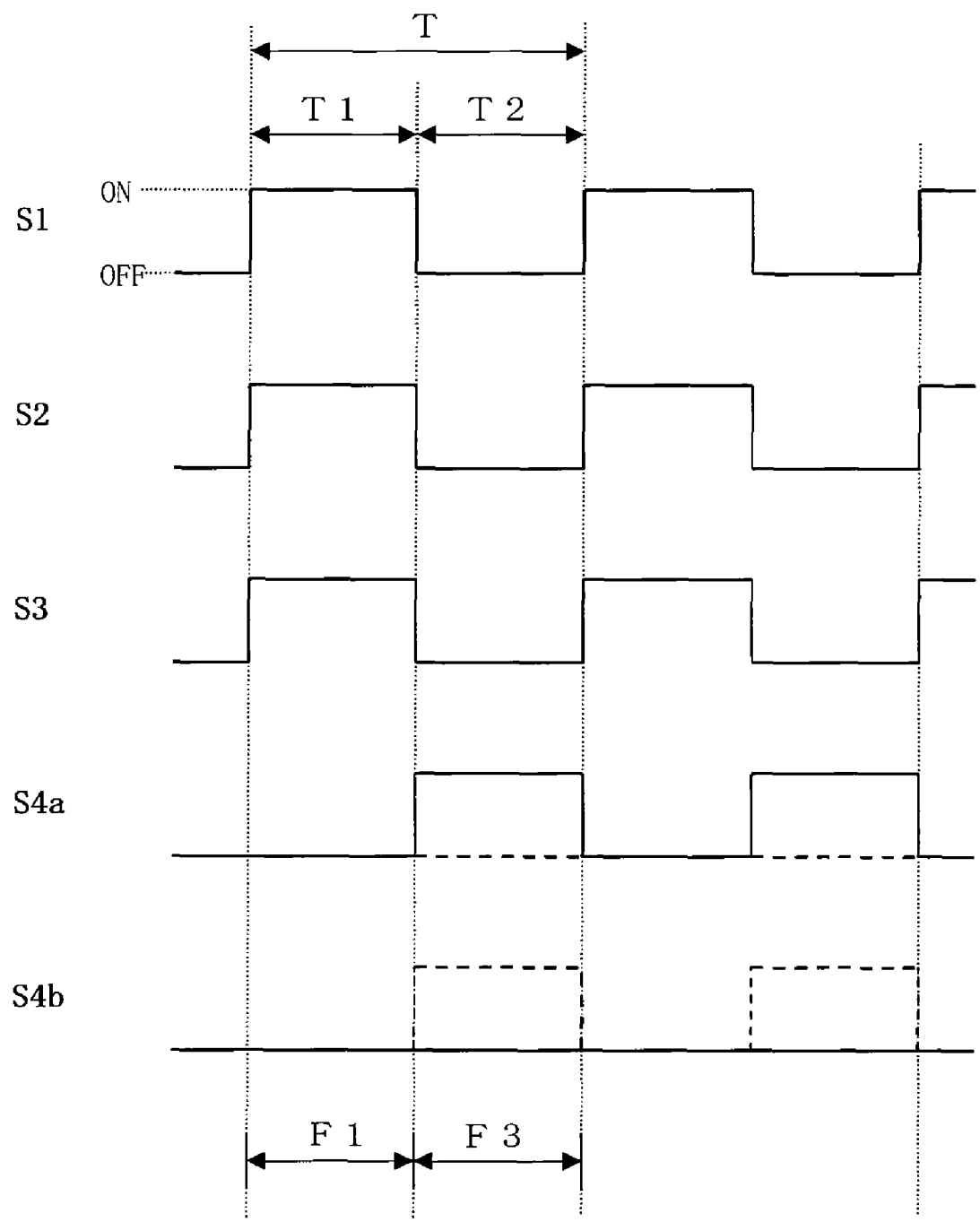
FIG. 3 is another example of a timing chart of the switch control signal in the magnetic sensor device according to the present invention.

Next, the operation to be performed in accordance with the switch control signals illustrated in FIG. 3 is described below. In the timing chart illustrated in FIG. 3, one period T in detection operation is divided into a first sample phase F1 and a comparison phase F3 according to the open/close states of the respective switches. In the first sample phase F1, the offset components of the Hall element 1, the differential amplifier 3, and the comparator 4 are stored in the capacitors C1 and C2. In the comparison phase F3, a voltage determined according to the magnetic field intensity is compared with the detection voltage level.

In the first sample phase F1, the Hall element 1 goes into the first detection state T1, and the switches S1, S2, and S3 turn on. When the switch S1 turns on, the comparator 4 operates as a voltage follower circuit. Accordingly, the capacitor C1 is charged with the difference ΔC1 between the voltage V3 and the voltage V5.

$$\Delta C1=V3-V5 \quad (53)$$

The capacitor C2 is charged with the difference ΔC2 between the voltage V6 and the voltage V8.

$$\Delta C2 = V6 - V8 = V6 - Vr1 \quad (54)$$

In the comparison phase F3, the Hall element 1 goes into the second detection state T2, and the switch S1 turns off. The capacitor C1 stores ΔC1, and hence the voltage V5 is represented by Expression (55).

$$V5 = V3 - \Delta C1 \quad (55)$$

At the same time, the switches S2 and S3 turn off, and the switch S4*a* turns on. As a result, because the capacitor C2 stores ΔC2, the voltage V6 is represented by Expression (56).

$$V6 = V8 + \Delta C2 = Vr2 + \Delta C2 \quad (56)$$

Accordingly, in the comparator 4, the voltage V5 represented by Expression (55) and the voltage V6 represented by Expression (56) are compared with each other, and an H signal (VDD) or an L signal (GND) is output.

Next, the signal transmission is calculated assuming that a differential output voltage in the output terminal pair of the Hall element 1 is Vh, an in-phase voltage is Vcm (≈VDD/2), an element offset voltage is Voh, a gain of the differential amplifier 3 is G, an input offset voltage at the first input terminal is Voa1, an input offset voltage at the second input terminal is Voa2, and an input offset voltage of the comparator 4 is Voa3. The calculation is made based on Expressions (53) to (56) described above. Because the output voltage component of the Hall element 1 is reversed in phase between the first detection state T1 and the second detection state T2, the element offset component is in phase. In the first sample phase F1, voltages at the respective nodes are represented as follows.

$$V1 = Vcm + Vh/2 + Voh/2 \quad (57)$$

$$V2 = Vcm - Vh/2 - Voh/2 \quad (58)$$

$$V3 = Vcm + G(Vh/2 + Voh/2 + Voa1) \quad (59)$$

$$V4 = V6 = Vcm + G(-Vh/2 - Voh/2 + Voa2) \quad (60)$$

$$V5 = V7 = Vcm + G(-Vh/2 - Voh/2 + Voa2) + Voa3 \quad (61)$$

$$\Delta C1 = G(Vh + Voh + Voa1 - Voa2) - Voa3 \quad (62)$$

$$\Delta C2 = Vcm + G(-Vh/2 - Voh/2 + Voa2) - Vr1 \quad (63)$$

In the comparison phase F3, voltages at the respective nodes are represented as follows.

$$V1 = Vcm - Vh/2 + Voh/2 \quad (64)$$

$$V2 = Vcm + Vh/2 - Voh/2 \quad (65)$$

$$V3 = Vcm + G(-Vh/2 + Voh/2 + Voa1) \quad (66)$$

$$V5 = Vcm + G(-3Vh/2 - Voh/2 + Voa2) + Voa3 \quad (67)$$

$$V6 = Vcm + G(-Vh/2 - Voh/2 + Voa2) + Vr2 - Vr1 \quad (68)$$

Comparison is made taking the input offset component of the comparator 4 at the time of comparison into consideration, that is, by adding the voltage Voa3 to the voltage V6 at the time of comparison.

$$(V6 + Voa3) - V5 = GVh + Vr2 - Vr1 \quad (69)$$

Accordingly, in the comparison phase F3, the signal component GVh and the detection voltage component (Vr1−Vr2) determined according to the resistance ratio of the bleeder resistors are compared with each other. As compared with a case of the timing chart illustrated in FIG. 2, there is an advantage that no second sample phase F2 is required, despite that the valid signal component decreases by half.

In the calculation of Expressions (57) to (69) described above, it is assumed that the differential amplifier 3 is configured as the instrumentation amplifier illustrated in FIG. 4. Alternatively, the circuit configuration of FIG. 5 may also be used. In this case, the same calculation is conducted as follows.

In the first sample phase F1, voltages at the respective nodes are represented as follows.

$$V1 = Vcm + Vh/2 + Voh/2 \quad (70)$$

$$V2 = Vcm - Vh/2 - Voh/2 \quad (71)$$

$$V3 = Vcm - Vh/2 - Voh/2 + Voa2 + G(Vh + Voh + Voa1 - Voa2) \quad (72)$$

$$V4 = V6 = Vcm - Vh/2 - Voh/2 + Voa2 \quad (73)$$

$$V5 = V7 = Vcm - Vh/2 - Voh/2 + Voa2 + Voa3 \quad (74)$$

$$\Delta C1 = G(Vh + Voh + Voa1 - Voa2) - Voa3 \quad (75)$$

$$\Delta C2 = Vcm - Vh/2 - Voh/2 + Voa2 - Vr1 \quad (76)$$

In the comparison phase F3, voltages at the respective nodes are represented as follows.

$$V1 = Vcm - Vh/2 + Voh/2 \quad (77)$$

$$V2 = Vcm + Vh/2 - Voh/2 \quad (78)$$

$$V3 = Vcm + Vh/2 - Voh/2 + Voa2 + G(-Vh + Voh + Voa1 - Voa2) \quad (79)$$

$$V5 = Vcm + Vh/2 - Voh/2 - 2GVh + Voa2 + Voa3 \quad (80)$$

$$V6 = Vcm - Vh/2 - Voh/2 + Voa2 + Vr2 - Vr1 \quad (81)$$

Comparison is made taking the input offset component of the comparator 4 at the time of comparison into consideration, that is, by adding the voltage Voa3 to the voltage V6 at the time of comparison.

$$(V6 + Voa3) - V5 = (2G - 1)Vh + Vr2 - Vr1 \quad (82)$$

Accordingly, in the comparison phase F3, the signal component (2G−1)Vh and the detection voltage component (Vr1−Vr2) determined according to the resistance ratio of the bleeder resistors are compared with each other.

In the operation performed in accordance with the switch control signals illustrated in FIG. 3, the in-phase voltage of the Hall element 1 need be set as the in-phase voltage Vcm common to the first detection state and the second detection state.

According to the driving method of the magnetic sensor device described with reference to the timing chart illustrated in FIG. 2 or 3, in one detection period T, magnetic intensity for one of a south pole and a north pole is detected. Accordingly, when detecting magnetic intensity for both of the south pole and the north pole, the detection period T is repeated twice. Here, the differential detection voltage Vh output to the output terminal pair of the Hall element 1 is reversed in phase between the south pole and the north pole. In other words, the signal component input to the comparator 4 is reversed in sign between a case of detecting the south pole and a case of detecting the north pole. Accordingly, the detection voltage set by the detection voltage setting circuit 5 requires a detection voltage identical in voltage value and reverse in sign. However, when the bleeder resistors are configured to output a detection voltage whose voltage value is identical but whose sign is reversed, there is a possibility that a manufacturing variation of the resistors affects the detection voltage.

In view of the above circumstances, the switching circuit 2 performs control so as to switch the connection of the output terminal pair of the Hall element 1 and the input terminal of the differential amplifier 3 in the detection of the south pole and the north pole. When the switching circuit 2 thus performs control, the detection voltage set by the detection voltage setting circuit 5 requires no detection voltage reverse in sign, and hence the circuit configuration of FIG. 1 may be employed. Accordingly, the resistor circuit may be configured by half, and the manufacturing variation of the resistor does not affect the detection voltage.

The detection voltage setting circuit 5 employs the switch S4b so as to provide hysteresis to the detection voltage. When the magnetic field intensity set by the switch S4a is detected, the switch that turns on in the comparison phase F3 in the subsequent detection period T is changed to the switch S4b. Likewise, when the detection of the magnetic field intensity is canceled, the switch that turns on in the comparison phase F3 in the subsequent detection period T is changed to the switch S4a. As a result, chattering at the time of detecting the magnetic field intensity and canceling the detection may be suppressed.

The detection voltage setting circuit 5 may include the switches S3, S3b, and S4a connected in the stated order from the GND side, according to sign of the valid signal component output from the Hall element 1.

Further, the magnetic sensor device according to the present invention may be used for alternation detection (for example, rotation detection of a motor). The magnetic sensor device for alternation detection is configured to switch from a state where only one polarity (for example, south pole) is detected to a state where only the other polarity (north pole) is detected upon detection of the one polarity.

Figure 2:
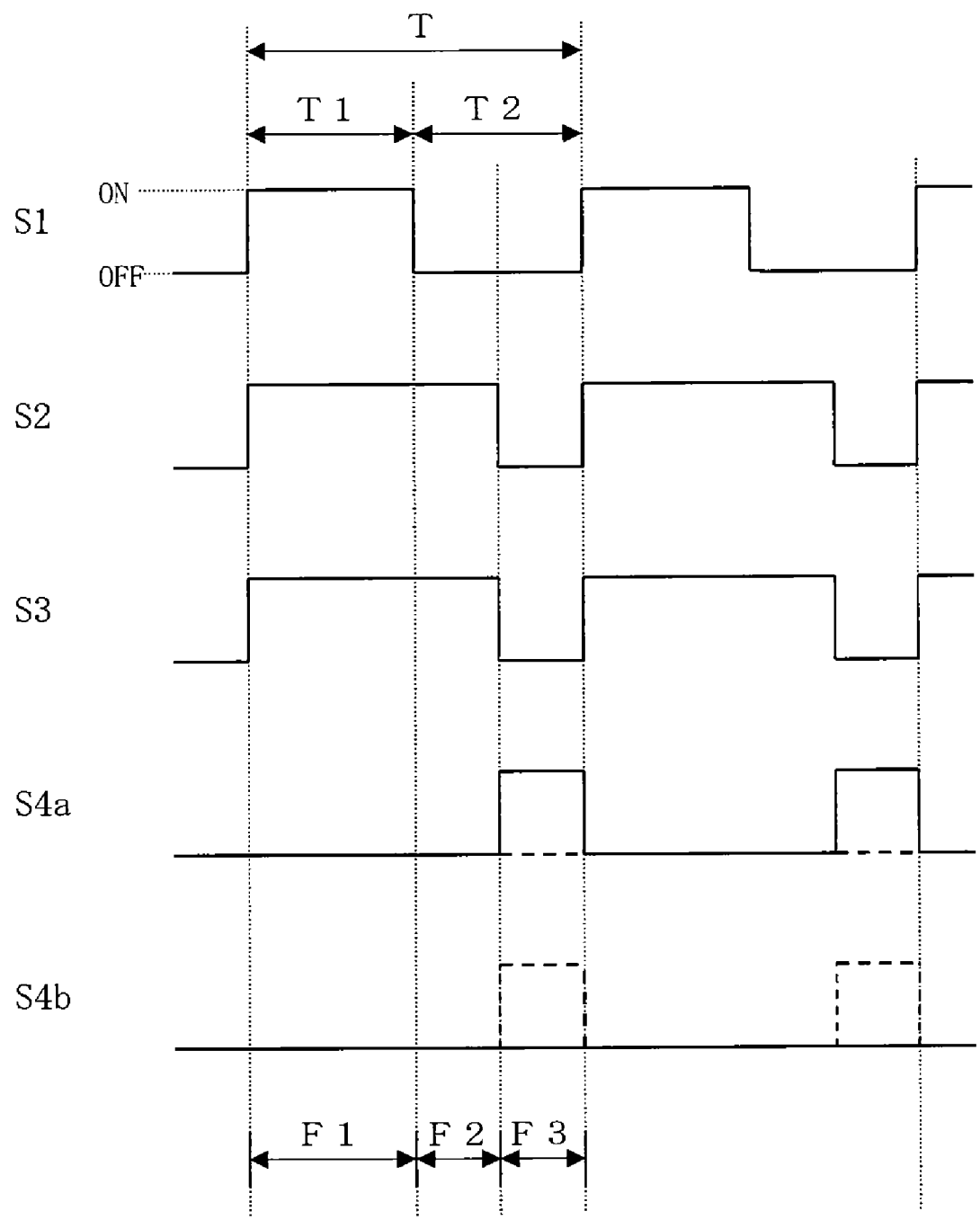
FIG. 2 is an example of a timing chart of a switch control signal in the magnetic sensor device according to the present invention.

Also, the driving method according to the timing chart of FIG. 2 or 3, may be changed such that a given standby period is provided between the detection period T and the subsequent detection period T so as to suppress an average current consumption of the magnetic sensor device, which produces the same effect.

What is claimed is:

1. A magnetic sensor device that conducts a logic output according to a magnetic field intensity applied to a magnetoelectric conversion element, the magnetic sensor device comprising:
    a switching circuit that is connected with a first terminal pair and a second terminal pair of the magnetoelectric conversions element, controls switching of a terminal pair to which a supply voltage is applied and a terminal pair to which detection voltage of the magnetic intensity is output, and has a first output terminal and a second output terminal which output the detection voltage;
    a differential amplifier that has a first input terminal and a second input terminal connected to the first output terminal and the second output terminal of the switching circuit, respectively, and has a first output terminal and a second output terminal which output results of differentially amplifying the detection voltage;
    a first capacitor having one terminal connected to the first output terminal of the differential amplifier;
    a second switch having one terminal connected to the second output terminal of the differential amplifier;
    a comparator that has a first input terminal connected to another terminal of the first capacitor and a second input terminal connected to another terminal of the second switch, and outputs a comparison result of voltages input to the first input terminal and the second input terminal to an output terminal;
    a first switch connected between the first input terminal and the output terminal of the comparator;
    a second capacitor having one terminal connected to the second input terminal of the comparator; and
    a detection voltage setting circuit connected to another terminal of the second capacitor.

2. A magnetic sensor device according to claim 1, wherein the detection voltage setting circuit comprises:
    a bleeder resistor having a first resistor, a second resistor, and a third resistor connected in series between a supply terminal and a ground terminal;
    a third switch disposed between a connection point of the first resistor and the second resistor, and the another terminal of the second capacitor; and
    a fourth switch disposed between a connection point of the second resistor and the third resistor, and the another terminal of the second capacitor.

3. A magnetic sensor device according to claim 2, wherein the detection voltage setting circuit further comprises:
    a fourth resistor in the bleeder resistor; and
    a fifth switch disposed between a connection point of the third resistor and the fourth resistor, and the another terminal of the second capacitor.

4. A magnetic sensor device according to claim 2, wherein the switching circuit has a function of switching between a first detection state and a second detection state, the first detection state corresponding to a state where the supply voltage is input to the first terminal pair of the magnetoelectric conversion element and the detection voltage is output from the second terminal pair, the second detection state corresponding to a state where the supply voltage is input to the second terminal pair of the magnetoelectric conversion element and the detection voltage is output from the first terminal pair.

5. A magnetic sensor device according to claim 4, wherein the logic output is conducted according to the magnetic intensity applied to the magnetoelectric conversion element, the magnetic intensity being varied among a first sample phase in which the first switch, the second switch, and the third switch are closed, and the fourth switch is opened in the first detection state,
    a second sample phase in which the second switch and the third switch are closed, and the first switch and the fourth switch are opened in the second detection state, and
    a comparison phase in which the first switch, the second switch, and the third switch are opened, and the fourth switch is closed in the second detection state.

6. A magnetic sensor device according to claim 4, wherein the logic output is conducted according to the magnetic intensity applied to the magnetoelectric conversion element, the magnetic intensity being varied between a first sample phase in which the first switch, the second switch, and the third switch are closed, and the fourth switch is opened in the first detection state, and
    a comparison phase in which the first switch, the second switch, and the third switch are opened, and the fourth switch is closed in the second detection state.

* * * * *